United States Patent
Liu et al.

(10) Patent No.: US 12,328,844 B2
(45) Date of Patent: *Jun. 10, 2025

(54) STRUCTURE FOR EVENLY APPLYING FORCES ON A HEAT DISSIPATION FIXING BASE

(71) Applicant: ASIA VITAL COMPONENTS (CHINA) CO., LTD., Shenzhen (CN)

(72) Inventors: Xue-Hui Liu, Shenzhen (CN); Lei Li, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 178 days.

This patent is subject to a terminal disclaimer.

(21) Appl. No.: 18/133,490

(22) Filed: Apr. 11, 2023

(65) Prior Publication Data

US 2023/0389233 A1 Nov. 30, 2023

(30) Foreign Application Priority Data

May 31, 2022 (TW) ................................. 111120246

(51) Int. Cl.
*H05K 7/20* (2006.01)
(52) U.S. Cl.
CPC ................................ *H05K 7/20418* (2013.01)
(58) Field of Classification Search
CPC ..... H05K 7/20418; H05K 7/20; H05K 7/2049
(Continued)

(56) References Cited

U.S. PATENT DOCUMENTS

| 6,724,629 | B1 * | 4/2004 | Augustin | ............ | H01L 23/4093 |
| | | | | | 174/16.3 |
| 6,906,923 | B2 * | 6/2005 | Lofland | ............... | H01L 23/4093 |
| | | | | | 24/457 |

(Continued)

FOREIGN PATENT DOCUMENTS

| CN | 2476918 Y | 2/2002 | | |
| CN | 2831711 Y | * 10/2006 | ........... | H01L 23/467 |

(Continued)

OTHER PUBLICATIONS

Search Report dated Nov. 4, 2022 issued by Taiwan Intellectual Property Office for counterpart application No. 111120246.

(Continued)

*Primary Examiner* — Anatoly Vortman
*Assistant Examiner* — Kyle Oxenknecht
(74) *Attorney, Agent, or Firm* — Demian K. Jackson; Jackson IPG PLLC

(57) ABSTRACT

A structure includes a heat dissipation fixing base having through bores formed at four corners thereof, screw fastening elements extended through the through bores for the heat dissipation fixing base to be fixed on and in contact with a heat source, and two spaced upward extended extension arms; a hold-down member disposed on the heat dissipation fixing base and having a pair of openings engaged with the two extension arms to assemble the hold-down member to the heat dissipation fixing base; and an adjustment element including a lever having an outer end formed into an eccentric cam having a shaft hole, and a shaft extended through the shaft hole to pivotally connect the eccentric cam to the extension arms. By swinging the lever, the eccentric cam will press against the hold-down member for the same to evenly apply downward forces on a central area of the heat dissipation fixing base.

3 Claims, 6 Drawing Sheets

(58) Field of Classification Search
USPC .......................................................... 361/707
See application file for complete search history.

(56) References Cited

U.S. PATENT DOCUMENTS

| | | | |
|---|---|---|---|
| 2008/0216997 A1 | 9/2008 | Wang et al. | |
| 2022/0011056 A1* | 1/2022 | Gupta | ................ H05K 7/20418 |
| 2023/0413490 A1* | 12/2023 | Liu | ..................... H01L 23/4006 |

FOREIGN PATENT DOCUMENTS

| | | | | |
|---|---|---|---|---|
| CN | 101207998 A | | 6/2008 | |
| CN | 101312641 A | | 11/2008 | |
| CN | 102891097 A | | 1/2013 | |
| CN | 111029317 A | | 4/2020 | |
| CN | 217546601 U | | 10/2022 | |
| TW | 520133 U | | 2/2003 | |
| TW | M250191 U | * | 11/2004 | ........... H01L 23/427 |
| TW | M324129 | | 12/2007 | |
| TW | 200805034 A | * | 1/2008 | |
| TW | M633392 U | | 10/2022 | |
| WO | 2022068908 A1 | | 4/2022 | |

OTHER PUBLICATIONS

Search Report dated Jul. 5, 2024 issued by China National Intellectual Property Administration for counterpart application No. 2022106139737.

* cited by examiner

STRUCTURE FOR EVENLY APPLYING FORCES ON A HEAT DISSIPATION FIXING BASE

This application claims the priority benefit of Taiwan patent application number 111120246 filed on May 31, 2022.

FIELD OF THE INVENTION

The present invention relates to a structure for evenly applying forces on a heat dissipation fixing base, and more particularly, to a structure that enables a heat dissipation fixing base or a heat transfer element to more evenly and fitly contact with a heat source while forces applied from the heat dissipation fixing base to the heat source is finely adjustable.

BACKGROUND OF THE INVENTION

Heat transfer element and heat dissipation element are a commonly seen combination for contacting with a heat source and transferring heat from the heat source to a remote location for dissipating into ambient air. Generally, the heat transfer element includes a base having better heat conductivity, it works together with heat pipes or vapor chambers to evenly guide out or transfer the heat produced by the heat source to a remote location for dissipation. However, the heat pipes or the vapor chambers must be fixed to the base, or be fixed to the base and a fixing seat located around the heat source.

Please refer to FIGS. 1a and 1b, which show a conventional thermal module. On a conventional motherboard of an electronic device, there is at least one heat source 1. Each of the heat sources 1 has a heat sink 4 correspondingly contacting therewith to dissipate heat produced by the heat source 1. To fix the heat sink 4 in place corresponding to the heat source 1, a fixing seat 2 is provided around the heat source 1, and the heat sink 4 is connected at four corners thereof to the fixing seat 2 using screw fasteners, so that the heat sink 4 is in contact with the heat source 1 to absorb and transfer the heat produced by the heat source 1 to a remote location.

Nowadays, high performance and high power chips are used in electronic devices for them to provide highly enhanced computing power. The chip in processing data will produce a relatively high amount of heat to form a heat source 1. Conventionally, the chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Further, there are also many currently available chips being provided in the form of bare dies without any package to protect their surfaces. The surface of a bare die is usually a non-smooth surface. When fixing the heat sink 4 to a top of the bare chip, i.e. the heat source 1, the fastening strength at the fixing points should be adjusted one by one to ensure that the heat sink 4 is in tight contact with the heat source 1 and prevent the heat source 1 in the form of bare die from breaking under excessive downward pressure from the heat sink 4. However, in the existing assembling manner, the heat sink 4 is fixed to the top of the heat source 1 (bare chip) on a production line with a power driver being handled manually or via a robotic arm to tighten screw fasteners at a very quick speed, and it is impossible to sequentially tighten the screw fasteners one by one in a diagonal direction and to make necessary adjustment of the tightening strength of the screw fasteners one by one. On the production line, each of the screw fasteners is quickly and fully tightened. This tends to result in uneven distribution of forces on four corners of the heat sink 4, and it is impossible for the heat sink 4 to completely flatly contact with the top of the heat source 1 and ensure whether a proper tightening strength is applied to the heat sink 4 and the heat source 1.

In the event the screw fasteners are not sequentially fastened in the diagonal direction, it is possible only the four corners of the heat sink 4 are tightly attached to the fixing seat 2 while a central area of the heat sink 4 corresponding to the heat source 1 is arched and deformed when the four corners of the heat sink 4 are downward pressed by the screw fasteners. A gap will form between the arched central area of the heat sink 4 and the heat source 1 and a thermal resistance will occur at the location with the gap to cause unevenly heated heat sink 4 or ineffective heat transfer of the heat sink 4. Meanwhile, in the event the heat sink 4 is directly fixed to the top of the heat source 1 with an excessive downward fastening force in one time, it tends to cause breaking or damage to the bare die.

It is therefore an important goal of thermal module manufacturers to make necessary improvement for all areas of the heat sink 4 to be in fit and tight contact with the heat source 1.

SUMMARY OF THE INVENTION

To effectively solve the problem in the conventional thermal module, a primary object of the present invention is to provide a structure for evenly applying forces on a heat dissipation fixing base, so that the entire heat dissipation fixing base is subjected to evenly distributed downward forces to be in fit and tight contact with a heat source; meanwhile, a bonding strength of the heat dissipation fixing base to the heat source is finely adjustable.

To achieve the above and other objects, the structure for evenly applying forces on a heat dissipation fixing base according to the present invention includes a heat dissipation fixing base, a hold-down member, and an adjustment element. The heat dissipation fixing base has an upper surface and a lower surface, and includes at least one through bore formed at each of four corners of the heat dissipation fixing base to extend from the upper surface to the lower surface; a screw fastening element extended through each of the through bores to fix the heat dissipation fixing base on a top of a heat source with the lower surface of the heat dissipation fixing base being in contact with the heat source; and two spaced extension arms upward extended from the upper surface of the heat dissipation fixing base. The hold-down member is disposed on the upper surface of the heat dissipation fixing base and has an upper side, a lower side, and a pair of openings extended through the hold-down member from the upper side to the lower side. The two extension arms are correspondingly extended through the two openings to thereby assemble the heat dissipation fixing base to the hold-down member. The adjustment element includes a lever, an end of the lever is an operating end and another end of the lever is formed into an eccentric cam. The eccentric cam has a shaft hole, and a shaft is extended through the shaft hole to pivotally connect the eccentric cam to the extension arms. By swinging the lever of the adjustment element, an outer peripheral edge of the eccentric cam is forced to press against the upper side of the hold-member member, and this brings the hold-down member to apply evenly distributed downward forces on a central area of the heat dissipation fixing base. By operating the lever of the adjustment element, it is able to finely adjust a contact force between the heat dissipation fixing base and the heat source and protect the heat source against breaking and damage due to excessive pressure applied to the heat source by the heat dissipation fixing base.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1b is an assembled sectional view of FIG. 1a;

DETAILED DESCRIPTION OF THE PREFERRED EMBODIMENTS

The present invention will now be described with a preferred embodiment thereof.

Figure 1A:
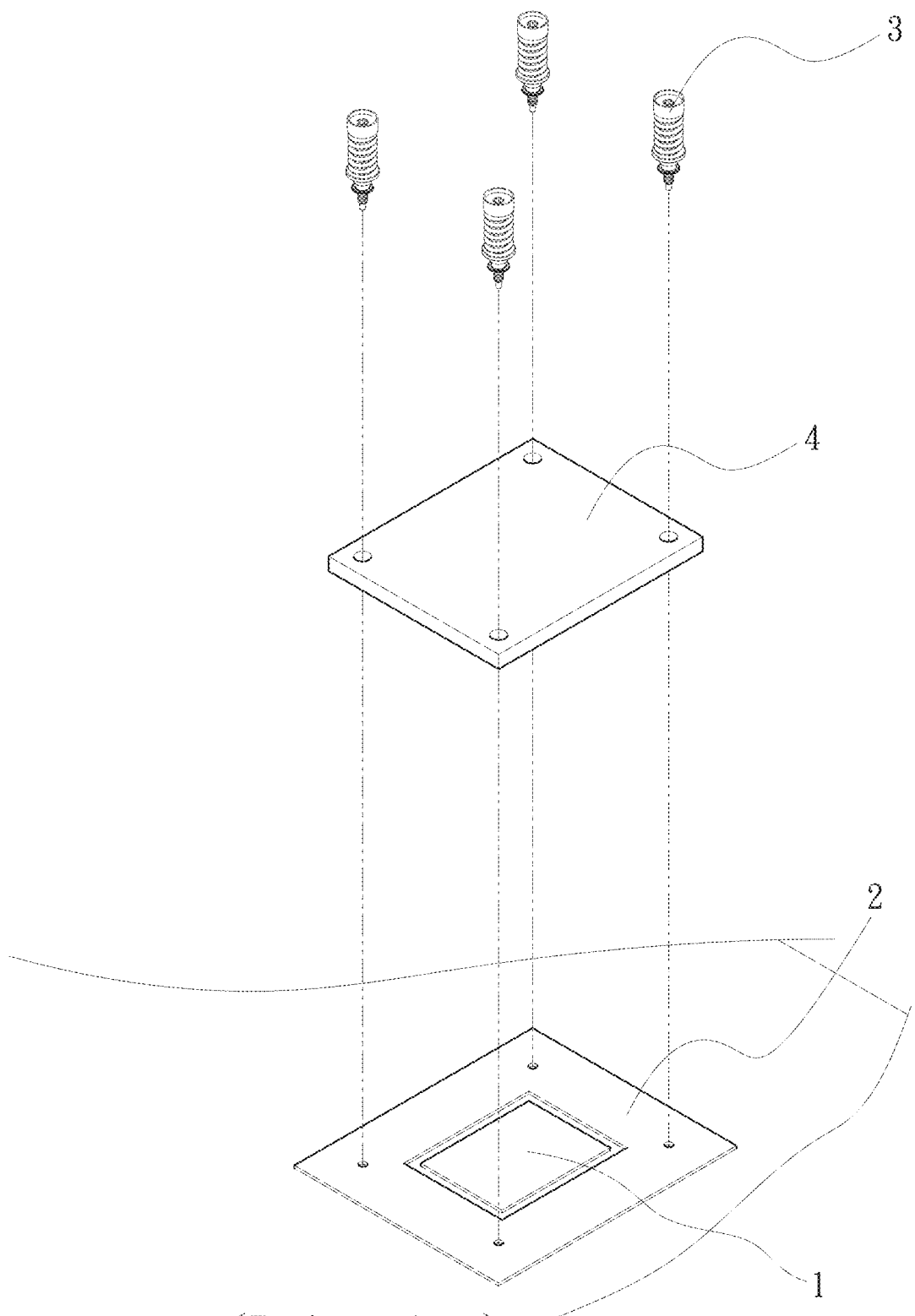
FIG. 1a is an exploded perspective view showing the connection of a conventional thermal module to a heat source.
Figure 1B:
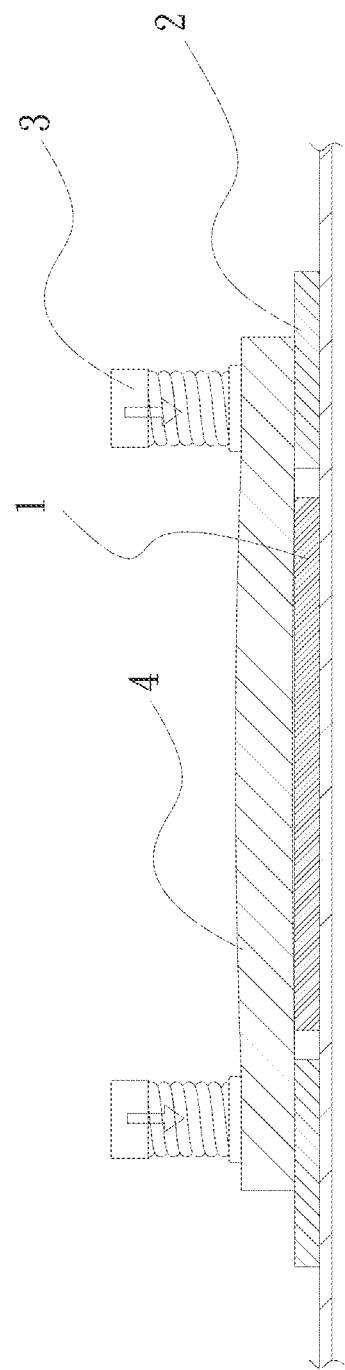
Figure 2:
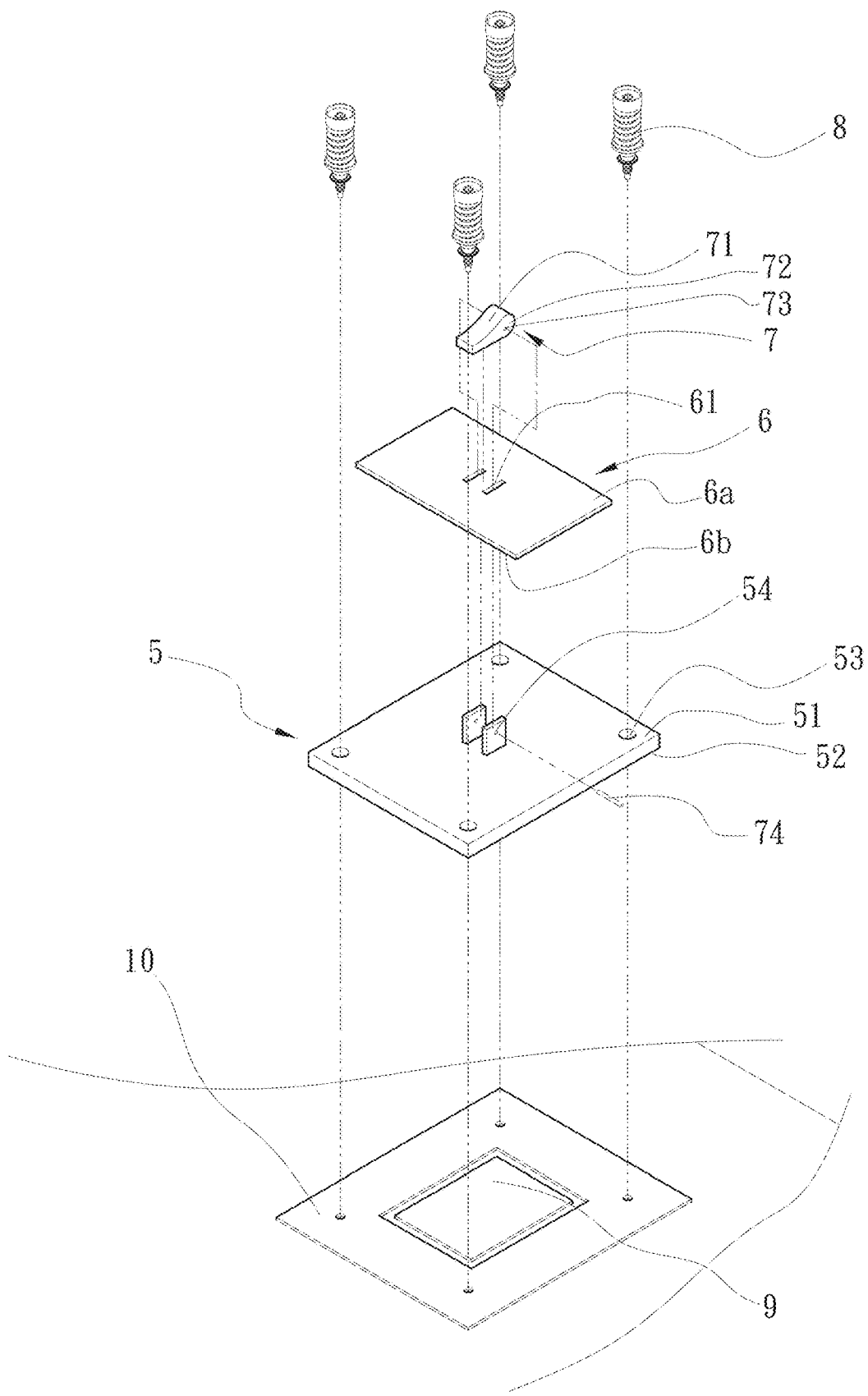
FIG. 2 is an exploded perspective view of a structure for evenly applying forces on a heat dissipation fixing base according to an embodiment of the present invention.
Figure 3A:
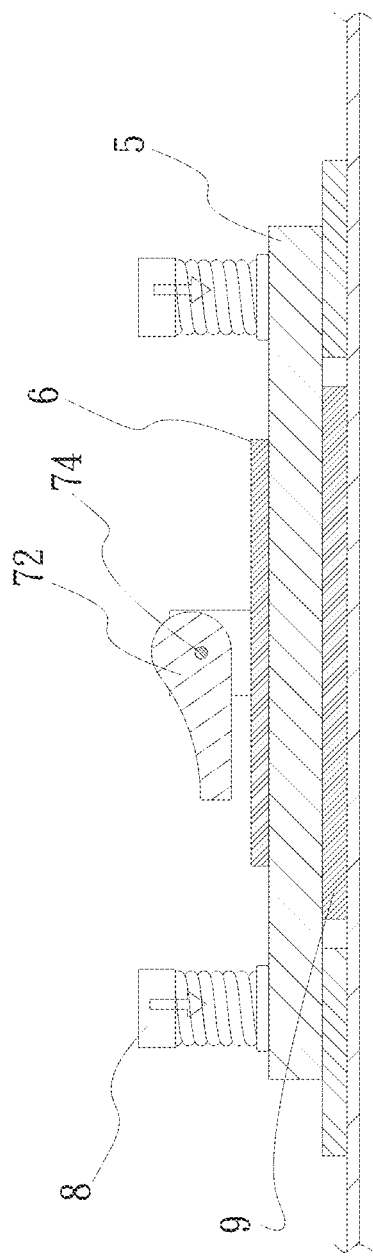
FIG. 3a is an assembled sectional view of FIG. 2 before a hold-down member is pressed against a heat dissipation fixing base of the present invention.
Figure 3B:
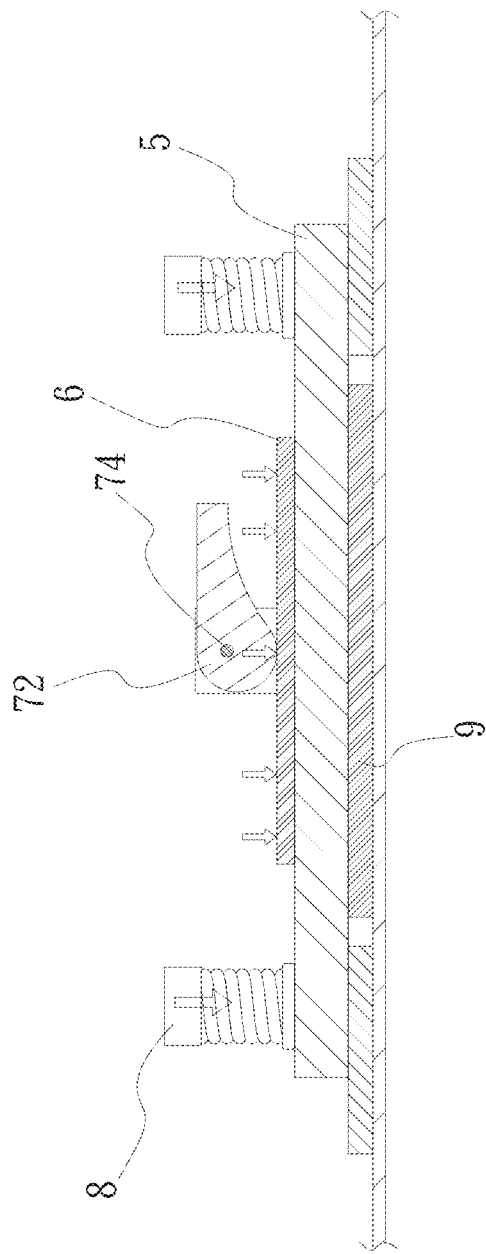
FIG. 3b is another assembled sectional view of FIG. 2 after the hold-down member is pressed against the heat dissipation fixing base of the present invention.

Please refer to FIG. 2, which is an exploded perspective view of a structure for evenly applying forces on a heat dissipation fixing base according to an embodiment of the present invention; and to FIGS. 3a and 3b, which are assembled sectional views of FIG. 2 before and after a hold-down member is pressed against a heat dissipation fixing base of the present invention. For the purpose of conciseness and clarity, the structure for evenly applying forces on a heat dissipation fixing base of the present invention is also briefly referred to as "the structure" herein. As shown, the structure includes a heat dissipation fixing base 5, a hold-down member 6, and an adjustment element 7.

The heat dissipation fixing base 5 has an upper surface 51 and a lower surface 52, and includes at least one through bore 53 formed at each of four corners of the heat dissipation fixing base 5. The through bores 53 extend from the upper surface 51 to the lower surface 52. A screw fastening element 8 is extended through each of the through bores 53 to fix the heat dissipation fixing base 5 on a top of a heat source 9 with the lower surface 52 of the heat dissipation fixing base 5 being in contact with the heat source 9. On the upper surface 51, there are two spaced and upward extended extension arms 54. More specifically, the heat dissipation fixing base 5 is screw fastened to a corresponding fixing seat, a circuit substrate, or a heat transfer element.

The hold-down member 6 has an upper side 6a and a lower side 6b, and includes a pair of openings 61. The lower side 6b of the hold-down member 6 is in contact with the upper surface 51 of the heat dissipation fixing base 5 and located in a central area of the upper surface 51. The openings 61 are extended through the hold-down member 6 from the upper side 6a to the lower side 6b. The extension arms 54 are correspondingly extended through the two openings 61 to thereby assemble the heat dissipation fixing base 5 to the hold-down member 6. The hold-down member 6 can be a plate, a sheet, a strip or a frame in a rectangular shape, a cross shape, a letter-X shape, a star shape, a letter-n shape, or a hollow square shape. The hold-down member 6 applies evenly distributed downward forces on the entire heat dissipation fixing base 5, such that not only the four corners but also a central area of the heat dissipation fixing base 5 are subjected to the evenly downward applied forces.

The adjustment element 7 includes a lever 71, an end of the lever 71 is an operating end and another end of the lever 71 is formed into an eccentric cam 72. The eccentric cam 72 has a shaft hole 73; and a shaft 74 is extended through the shaft hole 73 to pivotally connect the eccentric cam 72 to the extension arms 54, such that the lever 71 can be swung within a range from 0 degree to 180 degrees. The adjustment element 7 enables fine adjustment of a bonding strength between the hold-down member 6 and the heat dissipation fixing base 5. In other words, the hold-down member 6 provides the heat dissipation fixing base 5 with evenly distributed downward forces toward the heat source 9. In the case the heat source 9 is in the form of a bare die, the lever 71 of the adjustment element 7 can be properly operated to finely adjust the downward forces applied by the hold-down member 6 to the heat dissipation fixing base 5 and accordingly, protects the bare die from any breaking or damage on the surface thereof due to excessive downward pressure against the bare die.

The heat dissipation fixing base 5 and the heat source 9 may otherwise have a receiving space existing between them for receiving at least one heat transfer element therein. The heat transfer element is superposed on the heat source 9. The hold-down member 6 can apply evenly distributed downward forces on the heat dissipation fixing base 5 for the heat transfer element to more tightly contact with the heat source 9. The heat transfer element can be a heat pipe or a vapor chamber. In the illustrated embodiment, the heat transfer element may be a heat pipe. However, it is understood the present invention is not particularly limited thereto.

Figure 4:
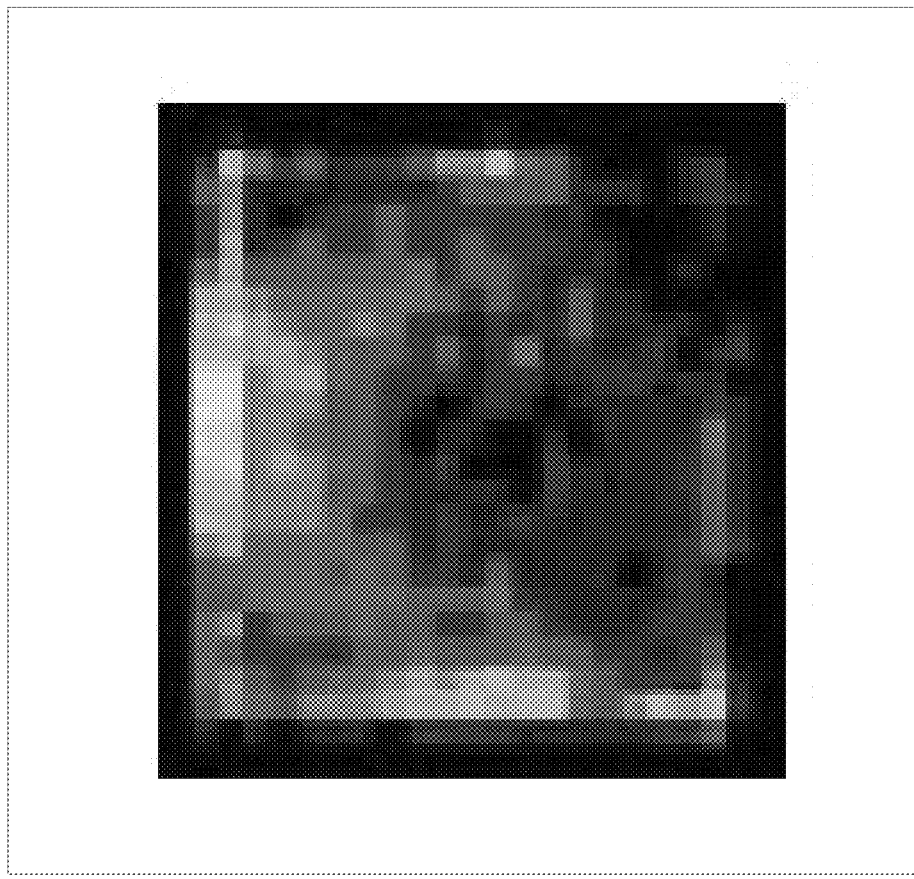
FIG. 4 is a thermogram of the structure for evenly applying forces on a heat dissipation fixing base according to the present invention.

FIG. 4 is a three-dimensional thermogram of the heat dissipation fixing base 5 in the present invention. Please refer to FIG. 4 along with FIGS. 2, 3a and 3b. When the screw fastening elements 8 are quickly extended through the through bores 53 at the four corners of the heat dissipation fixing base 5, the latter is fixedly fastened to a fixing seat 10 located around the hear source 9, and there is not any image in the thermogram showing it is affected by heat. Then, swing the adjustment element 7 at the lever 71 thereof for the eccentric cam 72 to press against the hold-down member 6. Since the eccentric cam 72 is eccentric relative to the shaft hole 73, an outer peripheral edge of the eccentric cam 72 is forced to press against the upper side 6a of the hold-member member 6 when the lever 71 of the adjustment element 7 is swung from a position of 0-degree to another position of 180-degree, and this brings the hold-down member 6 to slowly apply evenly distributed downward forces on the central area of the heat dissipation fixing base 5, allowing the entire heat dissipation fixing base 5 to fitly and tightly contact with the heat source 9. By doing this, the heat dissipation fixing base 5, which initially has only four corners fixed in place to the fixing seat 10 while the central area thereof is not in tight contact with the heat source 9, now has evenly distributed forces downward applied to its central area by the hold-down member 6. As a result, the heat dissipation fixing base 5 and the heat source 9 do not have any clearance existed between them to enable upgraded heat transfer performance.

At this point, the thermogram of FIG. 4 shows that a generally uniform color is distributed over all locations, which means the heat source 9 is under evenly distributed forces from the heat dissipation fixing base 5 and accordingly, heat from the heat source 9 is also evenly distributed in the thermogram.

The present invention is characterized in providing a structure for evenly applying forces on a heat dissipation fixing base 5 for the latter to fully tightly press against a heat source 9, so that heat can be evenly transferred from the heat source 9 to the heat dissipation fixing base 5 while effectively overcome the problem of thermal resistance that would occur if the heat source 9 and the heat dissipation fixing base 5 are not in full contact with one another. The structure of the present invention is also characterized in providing an adjustment element 7 for finely adjusting a bonding strength of the heat dissipation fixing base 5 to the heat source 9.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A structure for evenly applying forces on a heat dissipation fixing base comprising:

a heat dissipation fixing base having an upper surface and a lower surface, and including at least one through bore formed at each of four corners of the heat dissipation fixing base; a screw fastening element extended through each of the through bores to fix the heat dissipation fixing base on a top of a heat source with the lower surface of the heat dissipation fixing base in contact with the heat source; and two spaced extension arms upward extended from the upper surface of the heat dissipation fixing base;

a hold-down member disposed on the upper surface of the heat dissipation fixing base and having an upper side, a lower side, and a pair of openings; the openings extending through the hold-down member from the upper side to the lower side; and the two extension arms correspondingly extended through the two openings to thereby assemble the heat dissipation fixing base to the hold-down member; and an adjustment element including a lever, one end of the lever being an operating end and another end of the lever being formed into an eccentric cam eccentrically positioned with respect to an outer peripheral edge of the eccentric cam; the eccentric cam having a shaft hole, and a shaft extended through the shaft hole to pivotally connect the eccentric cam to the extension arms; and wherein, when the lever of the adjustment element is swung, the outer peripheral edge of the eccentric cam rotates about the shaft, forcing the hold-down member to apply evenly distributed downward forces on a central area of the heat dissipation fixing base.

2. The structure for evenly applying forces on a heat dissipation fixing base as claimed in claim 1, wherein the hold-down member is disposed on a central area of the upper surface of the heat dissipation fixing base.

3. The structure for evenly applying forces on a heat dissipation fixing base as claimed in claim 1, wherein the through bores extend through the heat dissipation fixing base from the upper surface to the lower surface.

* * * * *